United States Patent
Itoh et al.

(10) Patent No.: US 11,574,808 B2
(45) Date of Patent: Feb. 7, 2023

(54) PLASMA PROCESSING METHOD AND PLASMA PROCESSING APPARATUS

(71) Applicant: Tokyo Electron Limited, Tokyo (JP)

(72) Inventors: Satoshi Itoh, Yamanashi (JP); Norifumi Kohama, Kumamoto (JP); Soudai Emori, Yamanashi (JP); Nathan Ip, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 180 days.

(21) Appl. No.: 17/176,446

(22) Filed: Feb. 16, 2021

(65) Prior Publication Data

US 2022/0262631 A1     Aug. 18, 2022

(51) Int. Cl.
| | |
|---|---|
| *H01L 21/02* | (2006.01) |
| *C23C 16/34* | (2006.01) |
| *H01L 21/66* | (2006.01) |
| *H01J 37/32* | (2006.01) |
| *C23C 16/50* | (2006.01) |
| *C23C 16/52* | (2006.01) |

(52) U.S. Cl.
CPC ...... *H01L 21/02274* (2013.01); *C23C 16/345* (2013.01); *C23C 16/50* (2013.01); *C23C 16/52* (2013.01); *H01J 37/32403* (2013.01); *H01J 37/32449* (2013.01); *H01L 21/0217* (2013.01); *H01L 22/20* (2013.01); *H01J 2237/24585* (2013.01); *H01J 2237/3321* (2013.01)

(58) Field of Classification Search
None
See application file for complete search history.

(56) References Cited

U.S. PATENT DOCUMENTS

| | | | |
|---|---|---|---|
| 2021/0335606 A1* | 10/2021 | Dhas | H01L 21/67161 |
| 2021/0388500 A1* | 12/2021 | Shimabukuro | C23C 16/509 |

FOREIGN PATENT DOCUMENTS

| | | |
|---|---|---|
| JP | 2006-120703 | 5/2006 |
| JP | 2013-161960 | 8/2013 |
| JP | 2018-073880 | 5/2018 |
| JP | 2020-017606 | 1/2020 |
| JP | 2020-150133 | 9/2020 |
| JP | 2020-170643 | 10/2020 |
| JP | 2021-044201 | 3/2021 |

* cited by examiner

*Primary Examiner* — Asok K Sarkar
(74) *Attorney, Agent, or Firm* — IPUSA, PLLC

(57) ABSTRACT

A plasma processing method that is executed by a plasma processing apparatus including a processing container containing a target substrate, a plurality of plasma sources, and a gas supply apparatus for supplying gas includes: supplying the gas from the gas supply apparatus into the processing container; individually controlling intensity of power introduced from each of the plurality of plasma sources into the processing container; and generating plasma of the gas by the intensity of the power introduced from each of the plurality of plasma sources and depositing a desired film on a second surface of the target substrate that is an opposite surface of a first surface of the target substrate so as to apply desired film stress to a film on the first surface.

9 Claims, 9 Drawing Sheets

PLASMA PROCESSING METHOD AND PLASMA PROCESSING APPARATUS

BACKGROUND OF THE INVENTION

1. Field of the Invention

The present disclosure relates to a plasma processing method and a plasma processing apparatus.

2. Background Art

For example, Patent 1 discloses a plasma processing method of intruding microwaves from a plurality of plasma sources into a processing container to generate plasma for plasma processing a substrate.

The present disclosure provides a plasma processing method and a plasma processing apparatus that control stress of a film that is formed on a target substrate.

PRIOR ART DOCUMENT

Patent Document

[Patent Document 1] Japanese Laid-open Patent Publication No. 2013-161960

SUMMARY OF THE INVENTION

According to one aspect of the present disclosure, a plasma processing method that is executed by a plasma processing apparatus including a processing container containing a target substrate, a plurality of plasma sources, and a gas supply apparatus for supplying gas includes: supplying the gas from the gas supply apparatus into the processing container; individually controlling intensity of power introduced from each of the plurality of plasma sources into the processing container; and generating plasma of the gas by the intensity of the power introduced from each of the plurality of plasma sources and depositing a desired film on a second surface of the target substrate that is an opposite surface of a first surface of the target substrate so as to apply desired film stress to a film on the first surface.

According to one aspect, it is possible to control stress of a film that is formed on a target substrate.

DESCRIPTION OF THE EMBODIMENTS

Figure 1:
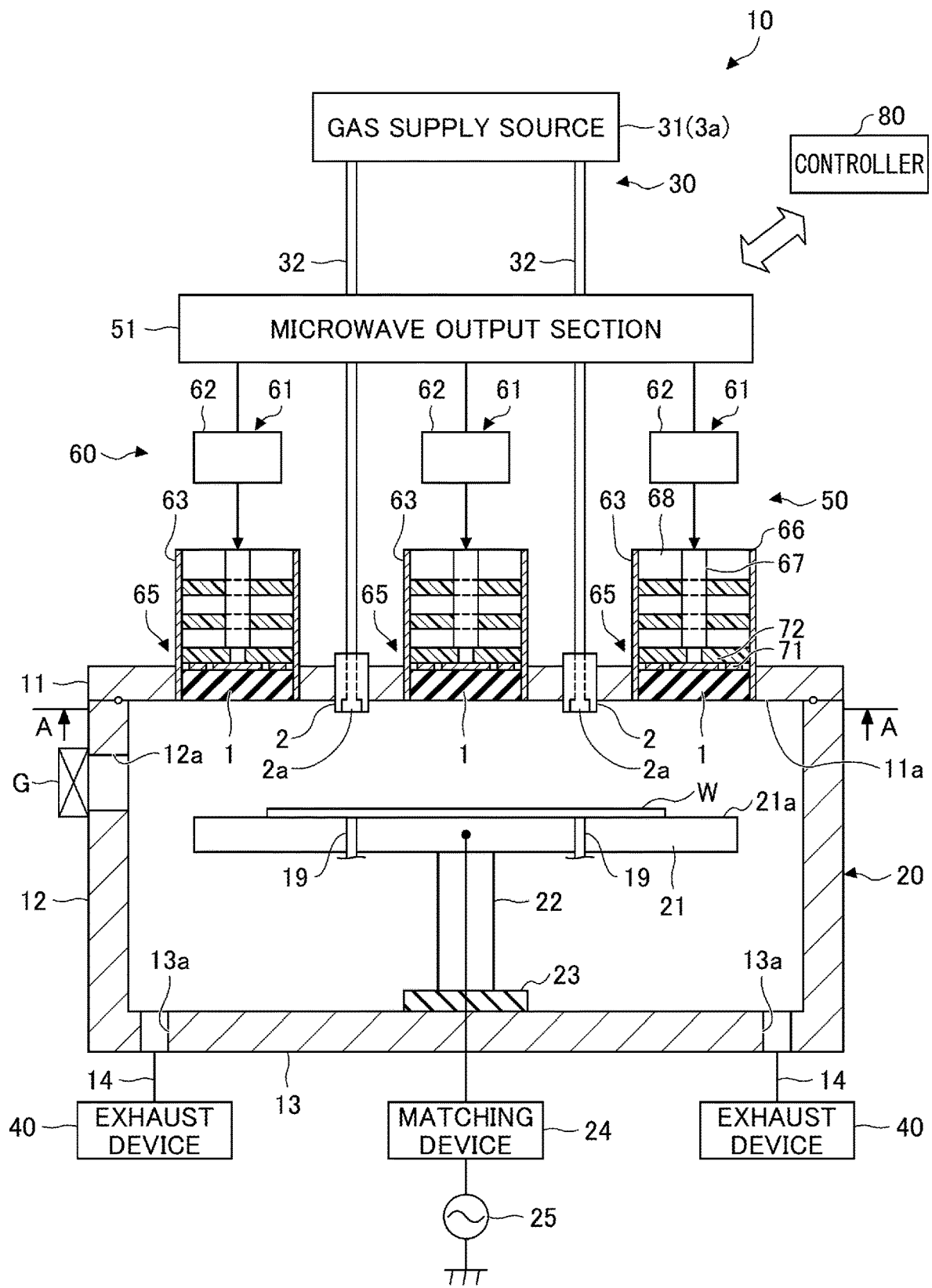
FIG. 1 is a schematic cross-sectional view illustrating an example of a plasma processing apparatus according to an embodiment.

In the following, an embodiment for carrying out the present disclosure will be described with reference to the drawings. In each drawing, the same components are indicated by the same reference numerals and overlapping descriptions may be omitted.

[Plasma Processing Apparatus]

A plasma processing apparatus 10 according to an embodiment will be described with reference to FIG. 1. FIG. 1 is a schematic cross-sectional view illustrating an example of the plasma processing apparatus 10 according to the embodiment. The plasma processing apparatus 10 according to the embodiment is an example of a CVD (chemical vapor deposition) deposition apparatus, and is a microwave plasma processing apparatus that generates plasma from processing gas by microwaves for plasma processing a substrate.

The plasma processing apparatus 10 includes a processing container 20, a mounting stage 21, a gas supply mechanism 30, exhaust devices 40, a microwave introduction module 50, and a controller 80. The processing container 20 contains a target substrate (hereinafter, referred to as a substrate W), which may be a wafer, for example. The mounting stage 21 is arranged within the processing container 20 and has a mounting surface 21a on which the substrate W is mounted. The gas supply mechanism 30 supplies gas into the processing container 20. The exhaust devices 40 evacuate the processing container 20 to be in a depressurized state. The microwave introduction module 50 introduces microwaves for converting processing gas supplied into the processing container 20 into plasma. The controller 80 controls each part of the plasma processing apparatus 10.

The processing container 20 may have a cylindrical shape, for example. The processing container 20 may be formed of a metallic material such as aluminum or its alloy, for example. The microwave introduction module 50 is arranged on the upper portion of (or above) the processing container 20 and functions as a plasma generator to introduce electromagnetic waves (microwaves in an embodiment) into the processing container 20 to generate plasma.

The processing container 20 has a plate-shaped top wall 11, a bottom wall 13, and a side wall 12 that couples the top wall 11 and the bottom wall 13. The top wall 11, which is a conductive member, is arranged on the top of the processing container 20, has a plurality of openings, and is configured such that the microwave introduction module 50 is fitted in each of the openings. The side wall 12 has a transportation port 12a for carrying in and carrying out the substrate W between the processing container 20 and a transportation chamber that is not illustrated and is adjacent to the processing container 20. A gate valve G is arranged between the processing container 20 and the transportation chamber, which is not illustrated. The gate valve G has a function of opening and closing the transportation port 12a. The gate valve G seals the processing container 20 airtightly in the closing state and enables the substrate W to be transportable between the processing container 20 and the transportation chamber in the opening state.

The bottom wall 13 has a plurality (two in FIG. 1) of exhaust ports 13a. The exhaust ports 13a and the exhaust devices 40 are connected by exhaust pipes 14. Each exhaust device 40 include an APC valve and a high-speed vacuum pump capable of depressurizing the internal space of the processing container 20 to a predetermined degree of vacuum. Examples of such a high-speed vacuum pump include a turbomolecular pump and the like. By operating the high-speed vacuum pump of each exhaust device 40, the internal space of the processing container 20 is depressurized to the predetermined degree of vacuum.

The plasma processing apparatus 10 further includes a support member 22 supporting the mounting stage 21 within the processing container 20 and an insulating member 23 provided between the support member 22 and the bottom wall 13. The mounting stage 21 is for horizontally mounting the substrate W. At the time of being carried in and carried out, the substrate W is raised by lift pins lifted by a lifting/lowering drive mechanism (not illustrated), and the substrate W is transferred between the transportation mechanism and the mounting stage 21. The support member 22 has a cylindrical shape extending from the center of the bottom wall 13 towards the interior space of the processing container 20. For example, the mounting stage 21 and the support member 22 may be formed of aluminum to which an alumite treatment (an anodizing treatment) is applied on the surface.

The plasma processing apparatus 10 further includes a high frequency bias power source 25 that supplies high frequency power to the mounting stage 21 and a matching device 24 provided between the mounting stage 21 and the high frequency bias power source 25. The high frequency bias power source 25 applies high frequency power to the mounting stage 21 to attract ions to the substrate W. The matching device 24 includes a circuit configured to match the output impedance of the high frequency bias power source 25 and the impedance of the load side (the mounting stage 21 side).

The plasma processing apparatus 10 may further include a temperature control mechanism, which is not illustrated, for heating or cooling the mounting stage 21. The temperature control mechanism may control the temperature of the substrate W within the range of 25° C. (room temperature) to 900° C., for example.

The gas supply mechanism 30 includes a gas supply apparatus 3a including a gas supply source 31 and pipes 32 connecting the gas supply source 31 and a plurality of gas nozzles 2. It should be noted that although the gas supply apparatus 3a includes a single gas supply source 31 as illustrated in FIG. 1, the gas supply apparatus 3a may include a plurality of gas supply sources depending on the type of gas used.

The gas supply apparatus 3a further includes a mass flow controller and an opening/closing valve that are not illustrated and are provided in the middle of the pipes 32. The type of gas supplied into the processing container 20 and the flow rate of gas are controlled by the mass flow controller and the opening/closing valve.

A plurality of gas nozzles 2 extending from the pipes 32 are cylindrically shaped and penetrate the top wall 11 and protrude in the vertical direction from the bottom surface 11a of the top wall 11. Each gas nozzle 2 supplies processing gas or the like from a gas supply hole 2a at the tip thereof into the processing container 20. For example, in a case in which a silicon nitride film is deposited, silane gas ($SiH_4$), nitrogen gas ($N_2$), and noble gas such as argon gas (Ar) are introduced into the processing container 20 from the gas supply holes 2a. The plurality of gas nozzles 2 may be provided on the side wall 12.

The microwave introduction module 50 includes a microwave output section 51, an antenna unit 60 and microwave radiators 63. The microwave output section 51 distributes microwaves into a plurality of paths and outputs the microwaves. The antenna unit 60 amplifies the microwaves output from the microwave output section 51 and introduces the amplified microwaves into the microwave radiators 63.

The antenna unit 60 includes a plurality of antenna modules 61. In the embodiment, the configurations of the plurality of antenna modules 61 are all the same. Each antenna module 61 includes an amplifier 62 that mainly amplifies and outputs the distributed microwaves, and a microwave radiator 63 that introduce the microwaves output from the amplifier 62 into the processing container 20.

One microwave radiator 63 is arranged at the center of the top wall 11 and six microwave radiators 63 are arranged at the outer periphery of the top wall 11 to radiate the microwaves into the processing container 20. The seven microwave radiators 63 are arranged at openings of the top wall 11. It should be noted that the microwave radiators 63 are not limited to seven in number, and the arrangement of these can be determined as appropriate. For example, a plurality of microwave radiators 63 may be arranged at the center. Also, a plurality of microwave radiators 63 may be arranged at the outer periphery other than the six.

Each microwave radiator 63 includes a tuner to match the impedance and an antenna section 65 to radiate the amplified microwaves into the processing container 20. Each microwave radiator 63 further includes a cylindrical main body container 66 made of a metallic material and extending in the vertical direction, and an inner conductor 67 extending in the same direction as the extending direction of the main body container 66 in the main body container 66. The main body container 66 and the inner conductor 67 constitute a coaxial tube. The main body container 66 constitutes an outer conductor of the coaxial tube. The inner conductor 67 may be rod-shaped or cylindrical. The space between the inner peripheral surface of the main body container 66 and the outer peripheral surface of the inner conductor 67 is a microwave transmission path 68.

Each antenna section 65 has a microwave delay material 72 connected to the lower end of the inner conductor 67, a planar antenna 71 in contact with the lower surface of the microwave delay material 72, and a microwave transmissive plate 1 in contact with the lower surface of the planar antenna 71. The microwave transmissive plate 1 fits through the main body container 66 into the opening in the top wall 11, and the lower surface of the microwave transmissive plate 1 is exposed in the interior space of the processing container 20. The microwave transmissive plate 1 functions as a transmissive window of microwaves.

The planar antenna 71 has a disc shape. Further, the planar antenna 71 has a slot formed to penetrate the planar antenna 71. The microwave delay material 72 is formed of a material having a dielectric constant larger than that of vacuum. As a material for forming the microwave delay material 72, for example, quartz, ceramics, a fluorine resin such as a polytetrafluoroethylene resin, a polyimide resin, or the like may be used. The wavelength of the microwaves lengthens in vacuum. The microwave delay material 72 has a function of adjusting plasma by shortening the wavelength of the microwaves. Further, the phase of the microwaves changes depending on the thickness of the microwave delay material 72. As a result, by adjusting the phase of the microwaves depending on the thickness of the microwave delay material 72, it is possible to adjust a slot position of the planar antenna 71 to be an antinode position of the standing wave.

That is, therefore, it is possible to efficiently introduce the power of the microwaves into the processing container 20.

The microwave transmissive plate 1 has a cylindrical shape. The microwave transmissive plate 1 is formed of a dielectric material. For example, quartz, ceramics, or the like may be used as the dielectric material that forms the microwave transmissive plate 1. The microwave transmissive plate 1 is shaped to be able to radiate microwaves efficiently in the TE mode.

Each of the components of the plasma processing apparatus 10 is connected to the controller 80 and is controlled by the controller 80. The controller 80 is a computer and includes a process controller with a CPU, a user interface and a storage connected to the process controller.

For example, the process controller is a controller configured to collectively control each component involved in process conditions such as temperature, pressure, a gas flow rate, high frequency power for bias application, and output of microwaves in the plasma processing apparatus 10. Examples of each component may include the high frequency bias power source 25, the gas supply source 31, the exhaust devices 40, the microwave introduction module 50, and the like.

The user interface 82 includes, for example, a keyboard or a touch panel for inputting commands by a process manager to manage the plasma processing apparatus 10, and a display for visually displaying the operation status of the plasma processing apparatus 10.

The storage stores a control program for realizing various processes executed in the plasma processing apparatus 10 by the control of the process controller and recipe in which processing condition data is recorded. The process controller calls and executes a desired control program or recipe from the storage unit as needed in accordance with an instruction from the user interface. Therefore, a desired process is performed in the processing container 20 of the plasma processing apparatus 10 under the control of the process controller.

The control program and recipe described above may be stored in a computer readable storage medium such as, for example, a flash memory, a DVD, a Blu-ray disc, or the like. The recipe may also be used online from other devices, for example, through a dedicated line whenever necessary.

As a program for executing a plasma processing method according to an embodiment described below, it is possible to use one stored in a computer-readable storage medium. The program for executing the plasma processing method may also be used online from another apparatus es via a dedicated line at any time, for example. The controller 80 has a storage medium in which a program for executing the plasma processing method is stored, and executes the stored program to perform the plasma processing method according to the embodiment in the plasma processing apparatus 10.

[Bottom Surface of Top Wall]

Figure 2:
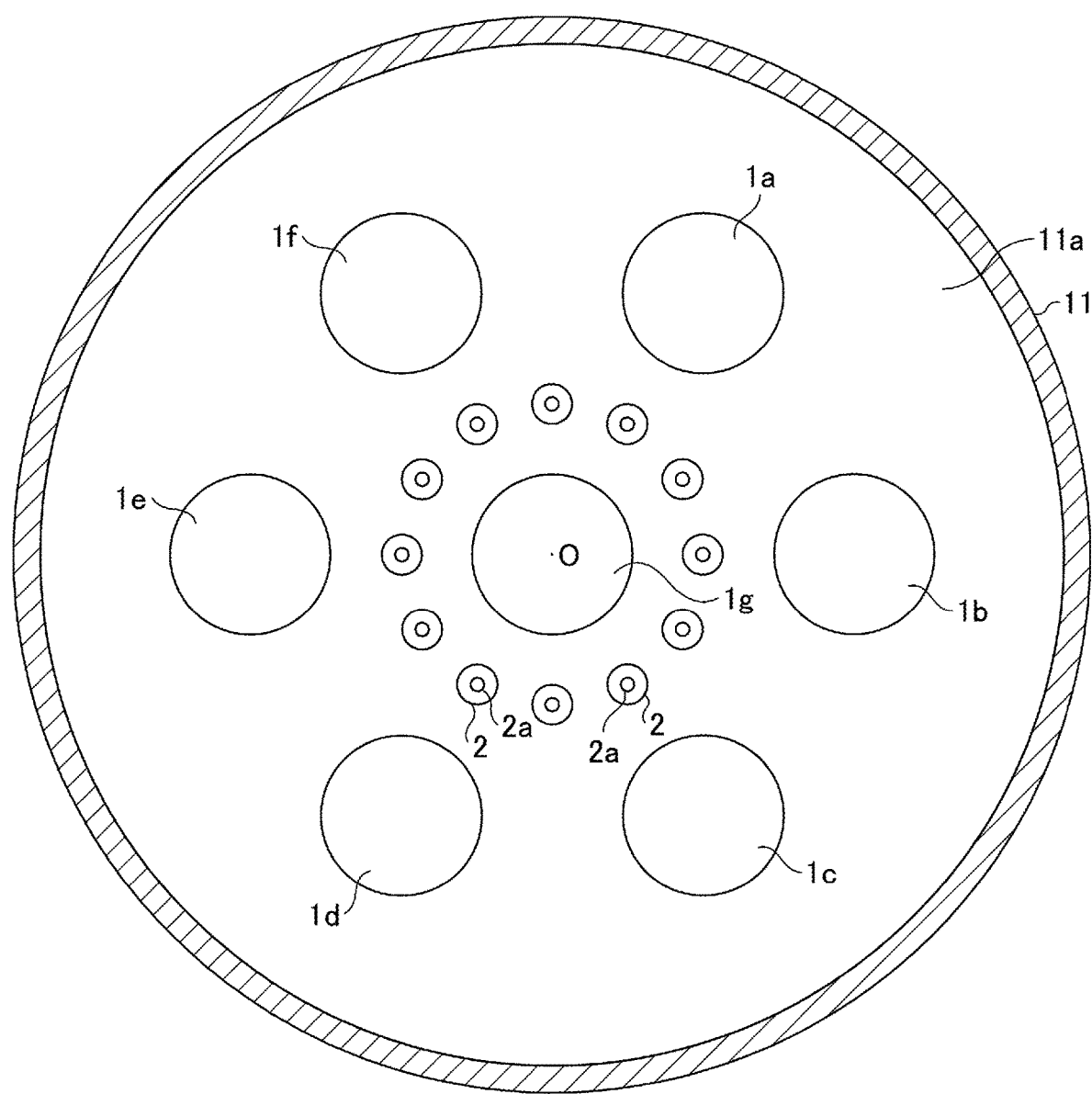
FIG. 2 is a diagram illustrating an example of a cross section taken along the line A-A of FIG. 1.

Next, with reference to FIG. 2, a microwave introduction mechanism of the bottom surface 11*a* of the top wall 11 of the processing container 20 illustrated in FIG. 1 will be described. FIG. 2 illustrates a cross section taken along the line A-A of FIG. 1 and is a diagram illustrating an example of the configuration of the bottom surface 11*a* of the top wall 11 of the processing container 20 according to the embodiment.

In the embodiment, seven microwave radiators 63 are arranged with an equal interval such that one is at the center and six are at the outer periphery, and the microwave transmissive plate 1*g* of the microwave radiator 63 at the center is exposed from the bottom surface 11*a* at the inner peripheral area of the top wall 11. The microwave transmissive plates 1*a* to 1*f* of the microwave radiators 63 at the outer peripheral area are exposed from the bottom surface 11*a* at the outer peripheral area of the top wall 11. The exposed surfaces of the microwave transmissive plates 1*a* to 1*g* are circular.

The microwave transmissive plates 1*a* to 1*g* are arranged point-symmetrically with the center point O as the axis. With respect to all the microwave transmissive plates 1*a* to 1*g*, the distances between the center points of any three adjacent microwave transmissive plates 1 are equal to each other. The twelve gas nozzles 2 are arranged with equal intervals in the circumferential direction between the microwave transmissive plates 1*a* to 1*f* in the outer peripheral area and the microwave transmissive plate 1*g* in the inner peripheral area.

The microwave introduction module 50 is an example of a plurality of plasma sources. In the embodiment, the the plurality of plasma sources are microwave plasma sources and refer to seven plasma sources that radiate microwaves from the respective microwave transmissive plates 1*a* to 1*g* of the microwave introduction module 50. In the following, the intensity of the power introduced into the processing container 20 from each of the seven plasma sources is individually controlled. That is, the intensity of the power of the microwaves radiated from the respective microwave transmissive plates 1*a* to 1*g* into the processing container 20 is individually controlled for the respective plasma sources. It should be noted that the microwave transmissive plate 1 is a general term for the microwave transmissive plate 1*a* to 1*g*. The center point of the seven plasma sources is indicated by O.

It should be noted that although an example is described in which a plurality of plasma sources represented by the microwave transmissive plates 1*a* to 1*g* at the bottom surface 11*a* of the top wall 11 are provided in the inner peripheral area and the outer peripheral area of the bottom surface 11*a*, the present disclosure is not limited to this. For example, at least one microwave transmissive plate 1 may be arranged in the inner peripheral area of the bottom surface 11*a* and at least three microwave transmissive plate 1 may be arranged in the outer peripheral area of the bottom surface 11*a*. For example, the inner peripheral area of the bottom surface 11*a* may be the area of the bottom surface 11*a* inward relative to the gas nozzles 2, and the outer peripheral area of the bottom surface 11*a* may be the area of the bottom surface 11*a* outward relative to the inner peripheral area of the bottom surface 11*a*.

[Film Structure of Substrate]

Figure 3:
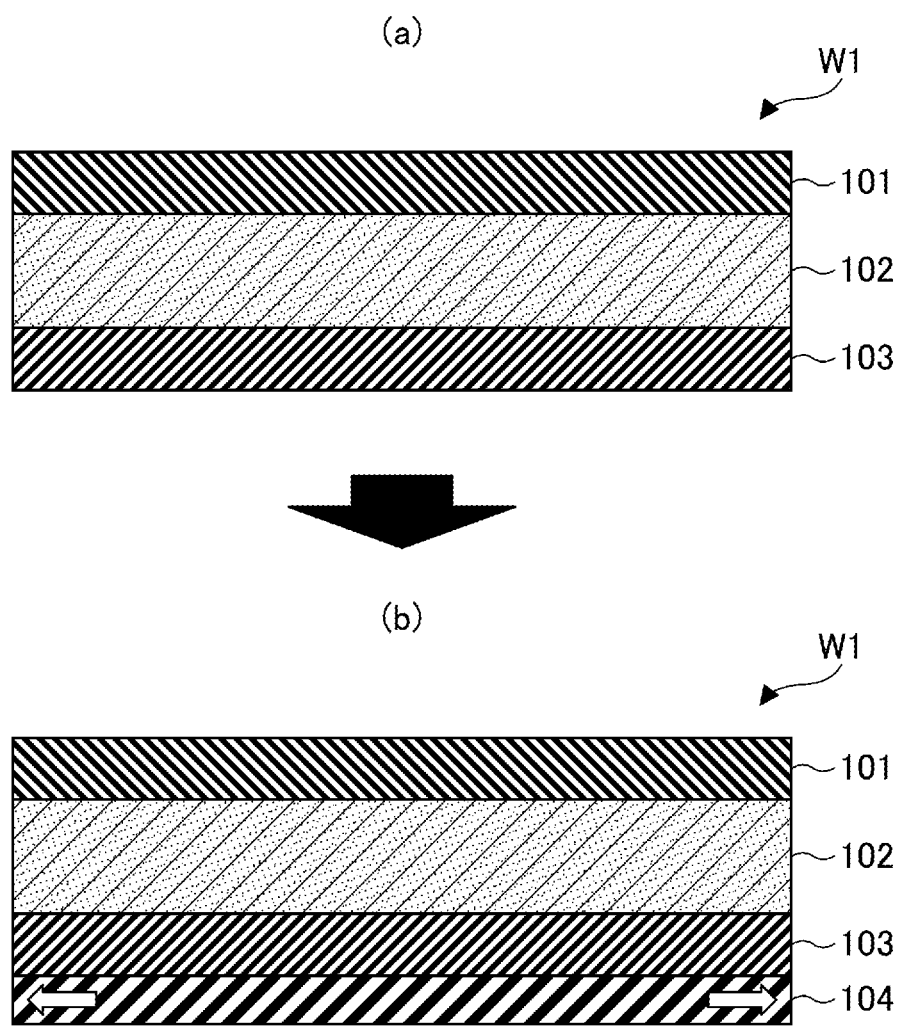
FIG. 3 is a diagram illustrating an example of a film structure of a substrate according to the embodiment.

Next, a film structure of the substrate W deposited by the plasma processing apparatus 10 having such a configuration will be described with reference to FIG. 3. FIG. 3 is a diagram illustrating an example of a film structure of a substrate W1 according to the embodiment. The substrate W1 is an example of the substrate W. As illustrated in FIG. 3(*a*), the substrate W1 has a film structure in which a silicon oxide film ($SiO_2$) 101 and a silicon oxide film 103 are respectively deposited on the front surface and the back surface of a base 102 of silicon (Si).

There is a step of bonding substrates W together. For example, a step is exemplified of bonding the silicon oxide film 101 on the front surface of the substrate W1 of FIG. 3(*a*) with a silicon oxide film 101 on the front surface of a substrate W2 (see FIG. 6) having the same film structure as the substrate W1. For example, by a step of TSV (through Silicon Via) or the like, the two substrates W are bonded together.

If either of the two substrates W is distorted, a void may occur on the bonded surface when the two substrates W are bonded together or the distorted state of the substrates W after being bonded may be deteriorated, which may cause a defective product. Also, a film deposited on the front surface of the two bonded substrates W may be peeled off due to stress or another problem may be caused.

Therefore, in the present embodiment, in order to control the stress of a film formed on the substrate W, with the front surface of the substrate W as a first surface and the back surface of the substrate W, which is the opposite surface of the first surface, as a second surface, a desired film is deposited on the second surface so as to apply desired film stress to the film on the first surface. As an example, with respect to the substrate W1 of the film structure illustrated in FIG. 3(a), a silicon nitride film (SiN) 104 as a desired film is formed on the back surface of the substrate W1 as illustrated in FIG. 3(b). The desired film has a compressive stress or tensile stress. The stress of the film is unique to the substance. It should be noted that in the following description, regardless of the orientation of the substrate W, the surface on which a desired film is formed is referred to as the back surface (second surface) of the substrate W, and the surface on the opposite side of the surface on which the desired film is formed is referred to as the front surface (first surface) of the substrate W.

For example, in a case in which the silicon nitride film 104 is deposited on the back surface of the substrate W1, the silicon nitride film 104 has a compressive stress. The direction of the stress of the silicon nitride film 104 is illustrated by the white arrows in FIG. 3(b). By depositing the silicon nitride film 104 on the back surface of the substrate W1, the compressive stress indicated by the white arrows acts to change the distribution of the film stress of the silicon oxide film 101 on the front surface.

In a case in which a silicon oxide film is deposited on the back surface of the substrate W1, the silicon oxide film has a tensile stress. Therefore, the direction of the stress of the silicon oxide film on the back surface becomes opposite to the direction of the white arrows illustrated in FIG. 3(b). Therefore, depending on the type of a film deposited on the back surface of the substrate W1, the distribution of the film stress of the silicon oxide film 101 on the front surface can be changed.

Also, the desired film stress can be applied to the silicon oxide film 101 on the front surface of the substrate W by controlling the deposition amount of a film deposited on the back surface of the substrate W, that is, by controlling the film thickness. In the plasma processing method according to the embodiment, the gas supply apparatus 3a supplies gas containing silicon and nitrogen to deposit the silicon nitride film 104. Examples of the gas containing silicon and nitrogen include silane ($SiH_4$) gas and ammonia ($NH_3$) gas.

The deposition amount of the silicon nitride film 104 deposited on the back surface of the substrate W can be controlled with the intensity of the power of the microwaves introduced into the processing container 20 from the seven plasma sources (the microwave introduction module 50) that radiate the microwaves through the microwave transmissive plates 1a to 1g. The deposition amount of the silicon nitride film 104 increases as the intensity of the power of the microwaves of each plasma source increases. That is, the film thickness of the silicon nitride film 104 is thickened.

The distribution of the silicon nitride film 104 deposited on the back surface of substrate W is affected by the power of the microwaves introduced from each of the seven plasma sources. That is, at the position of the back surface of the substrate W below the position of each of the seven plasma sources, the silicon nitride film 104 is deposited with the deposition amount in accordance with the intensity of the power of the microwaves introduced from each plasma source. In a case in which microwaves output from a plasma source are in the on state (state in which microwaves are output), a silicon nitride film 104 with a film thickness in accordance with the intensity of the power of the microwaves is deposited at the position of the back surface of the substrate W below the plasma source.

For example, in the depositing step of the silicon nitride film 104, the silicon nitride film 104 may be deposited on the back surface of the substrate W with the deposition amount in accordance with the intensity of the power of the microwaves introduced from each plasma source so as to apply film stress to adjust the distortion of the film on the front surface of the substrate W. Regardless of the state of the distortion of the silicon oxide film 101 on the front surface of the substrate W before depositing the silicon nitride film 104 on the back surface, in order to forcibly form a desired distortion in the film on the front surface of the substrate W, the silicon nitride film 104 may be deposited on the back surface of the substrate W with the deposition amount in accordance with the intensity of the power of the microwaves introduced from each plasma source. Accordingly, the distortion state of the silicon oxide film 101 on the front surface of the substrate W can be made freely. In other words, by controlling the intensity of the power of the microwaves introduced from each of the plurality of plasma sources, the deposition amount of the silicon nitride film 104 deposited on the back surface of the substrate W and the distribution in the back surface of the substrate W can be controlled.

The silicon nitride film 104 may be deposited on the back surface of the substrate W with the deposition amount in accordance with the intensity of the power introduced from each plasma source to apply film stress that corrects the distortion of the silicon oxide film 101. For example, the silicon nitride film 104 may be deposited on the back surface of the substrate W with the deposition amount in accordance with the intensity of the power introduced from each plasma source so as to apply film stress that smooths the distortion of the surface of the silicon oxide film 101.

Control of the intensity of the power of microwaves includes control of the on state and the off state of the plurality of plasma sources. That is, control of the intensity of the power of microwaves includes control of the power of microwave from 0 (i.e., the off state) to greater than 0 (i.e., the on state).

In the on state, the intensity (level) of the power can be controlled stepwise or continuously. Below a plasma source with the power of microwaves controlled to the on state, a silicon nitride film 104 is deposited with a deposition amount in accordance with the intensity of the power. Thus, by controlling the intensity of the power of microwaves radiated from each plasma source to be 0 or a value greater than zero, the distribution of the silicon nitride film 104 in the back surface of the substrate W can be controlled, and the deposition amount of the silicon nitride film 104 can be controlled. Accordingly, it is possible to apply, to the silicon oxide film 101 on the front surface of the substrate W, film stress in accordance with the deposition amount and the deposition position of the silicon nitride film 104, and it is possible to adjust the distortion of the silicon oxide film 101 on the front surface of the substrate W. Hereinafter, "controlling the on/off state of a plasma source" is an example of controlling the intensity of the power of microwaves, and the off state of a plasma source indicates controlling the intensity of the power of microwaves to be zero. The on state of a plasma source indicates controlling the intensity of the power of microwaves to be a value greater than zero. The value of the intensity of the power in the on state may be individually controlled at each plasma source. That is, the value of the intensity of the power in the on state may be controlled to be a value differing for each plasma source or may be controlled variably with the passage of time.

[Plasma Processing Method]

Figure 4:
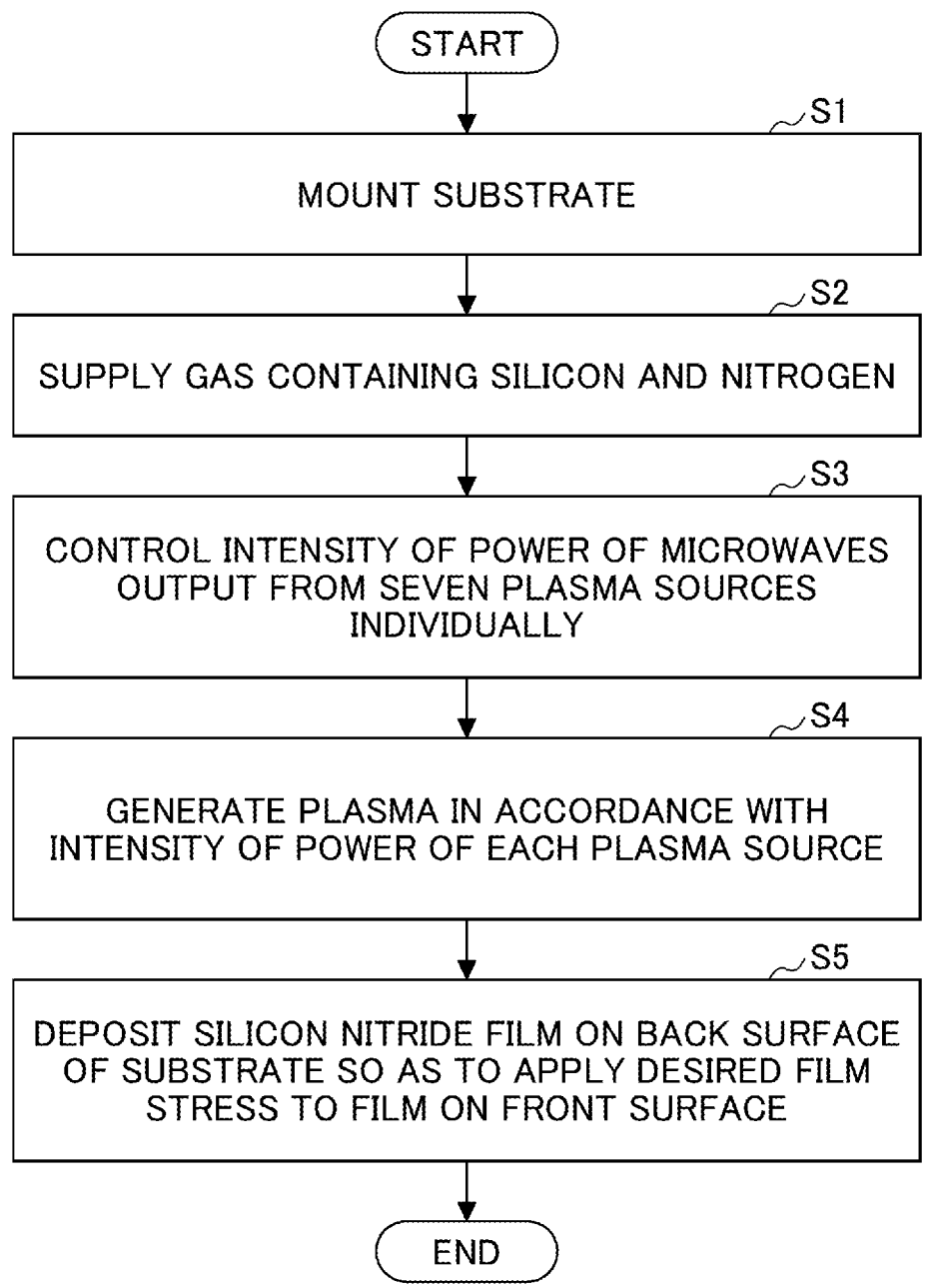
FIG. 4 is a flowchart illustrating an example of a plasma processing method according to an embodiment.

A plasma processing method according to the embodiment to perform back surface deposition of the silicon nitride film 104 described above will be described with reference to FIG. 4. FIG. 4 is a flowchart illustrating an example of a plasma processing method according to the embodiment.

The present process is controlled by the controller 80. Upon the present process being started, the controller 80 carries the substrate W into the processing container 20 and mounts it on the mounting stage 21 (step S1). At this time, the substrate W is mounted so that the back surface of the substrate W, which is the surface to be subject to deposition, is oriented upward. Next, the controller 80 supplies, as an example of gas containing silicon and nitrogen, silane gas and ammonia gas from the gas supply apparatus 3a into the processing container 20 (step S2).

Next, the controller 80 controls the intensity of the power of microwaves output from the seven plasma sources individually for each of the plasma sources (step S3). Control of the intensity of the power of microwaves includes the off state and the on state. Also, control of the intensity of the power of microwaves includes various intensities of the power in the on state.

Next, plasma in accordance with the intensity of the power of each plasma source is generated from the seven plasma sources (step S4). Here, the plasma of the gas containing silicon and nitrogen is generated in accordance with the intensity of the power of each plasma source.

Next, using the plasma generated so as to apply desired film stress to the silicon oxide film 101 on the front surface of the substrate W, the controller 80 deposits a silicon nitride film 104 on the back surface of the substrate W (step S5). Thus, the compressive stress generated at the substrate W is adjusted. After the silicon nitride film 104 is deposited on the back surface of the substrate W, this process is completed. In a case of depositing another desired film on the back surface instead of the silicon nitride film 104 in step S5, gas for depositing said another desired film is supplied in step S2.

Example 1

Figure 5:
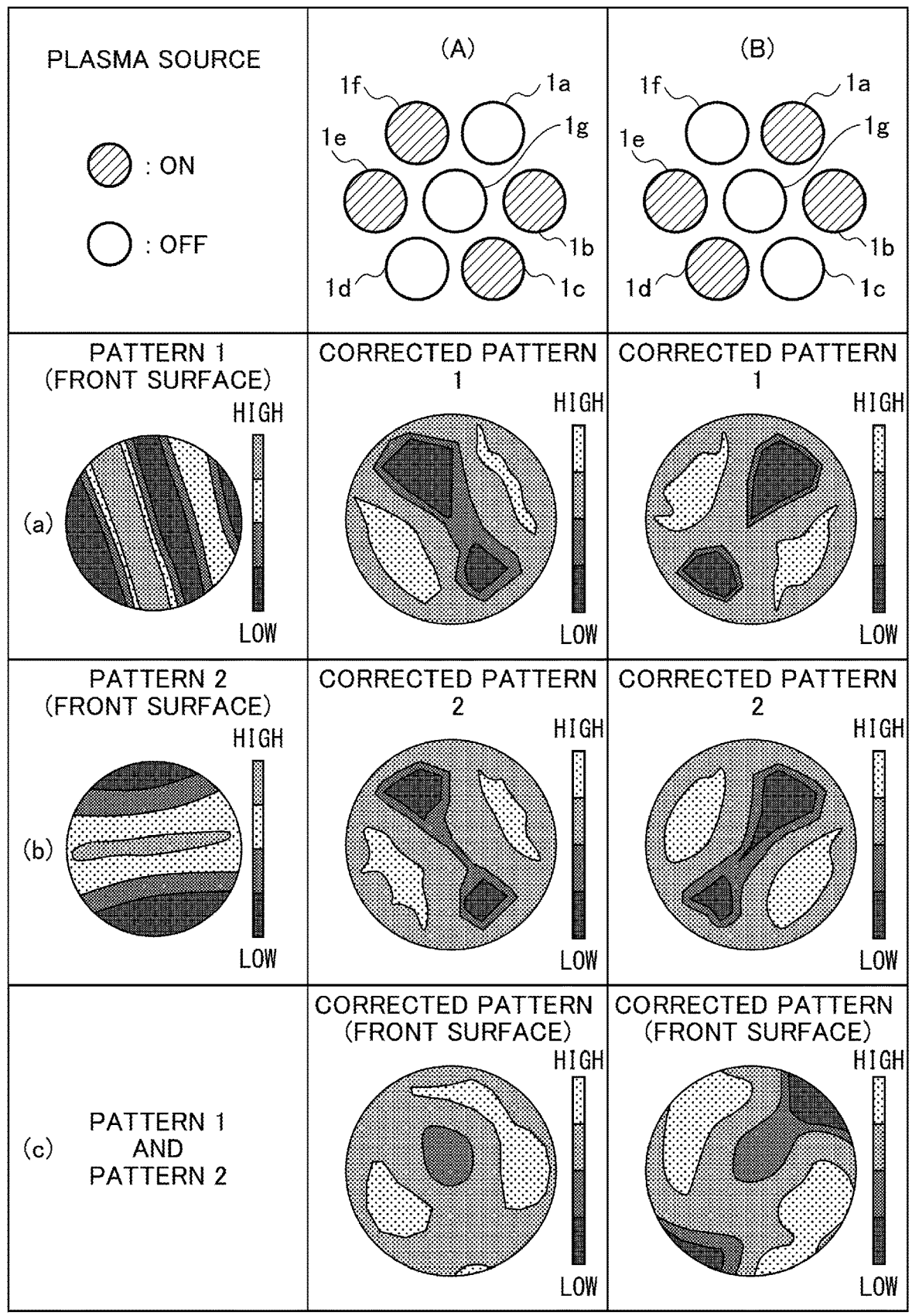
FIG. 5 is a diagram illustrating an example of Example 1 of the plasma processing method according to the embodiment.

As a result of carrying out Example 1 of the plasma processing method according to the embodiment described above, the state of the film on the substrate W is illustrated in FIG. 5. FIG. 5 is a diagram illustrating an example of Example 1 of the plasma processing method according to the embodiment.

In (A) and (B) at the top of FIG. 5, for each plasma source of seven plasma sources, diagonal lines indicate that the output of microwaves is controlled to the on state and a white circle indicates that the output of microwaves is controlled to the off state. When the output of microwaves is controlled to the on state, the intensity of the microwaves output from a plasma source may differ from one plasma source to another and is controlled individually. The silicon nitride film 104 is not deposited on the back surface of the substrate W below the plasma sources controlled to be in the off state.

The pattern 1 (front surface) of FIG. 5(*a*: leftmost) illustrates the measurement result of the state of the unevenness (distortion) of the silicon oxide film 101 on the front surface of a substrate W1 a the diameter of 300 mm, which is an example of the substrate W before the back surface deposition.

As illustrated in FIG. 5(A), the silicon nitride film 104 was deposited on the back surface of the substrate W1 with the deposition amount in accordance with the intensity of the power of microwaves output from the plasma sources. Thereafter, the unevenness of the silicon oxide film 101 on the front surface of the substrate W1 was measured. The corrected pattern 1 of FIG. 5(*a*: center) illustrates the difference between the measured value of the unevenness of the silicon oxide film 101 on the front surface of the substrate W1 before the back surface deposition illustrated in the pattern 1 of FIG. 5(*a*: leftmost) and the measured value of the unevenness of the silicon oxide film 101 on the front surface of the substrate W1 after the back surface deposition of the silicon nitride film 104.

That is, the corrected pattern 1 illustrates the distribution of the change amount by which the distortion of the silicon oxide film 101 on the front surface of the substrate W1, that is, the unevenness of the front surface is changed due to the film stress applied to the silicon oxide film 101 on the front surface of the substrate W by depositing the silicon nitride film 104 on the back surface of the substrate W1.

For FIG. 5(A), the plasma sources of the microwave transmissive plates 1a, 1d, and 1g are controlled to be in the off state and the other plasma sources are controlled to be in the on state. In this case, the silicon nitride film 104 is not deposited at the areas below the plasma sources of the microwave transmissive plates 1a, 1d, and 1g. Below the plasma sources of the other microwave transmissive plates 1b, 1c, 1e, 1f, and 1g, the silicon nitride film 104 is deposited on the back surface with the deposition amount in accordance with the intensity of the power of microwaves output from each plasma source.

As a result, for the substrate W1, the desired unevenness illustrated in the corrected pattern (front surface) of FIG. 5(*c*: center) could be made on the surface of the corrected silicon oxide film 101. That is, for the substrate W1, it was possible to forcibly distort the silicon oxide film 101 into the corrected pattern (front surface) of FIG. 5(*c*: center) in accordance with the deposition amount of the silicon nitride film 104 on the back surface regardless of the distortion distribution of the surface of the silicon oxide film 101 of the pattern 1 illustrated in FIG. 5(*a*: leftmost) of the substrate W1 before the back surface deposition.

For FIG. 5(B), the plasma sources of the microwave transmissive plates 1c, 1f, and 1g are controlled to be in the off state and the other plasma sources are controlled to be in the on state. In this case, the silicon nitride film 104 is not deposited at the areas below the plasma sources of the microwave transmissive plates 1c, 1f, and 1g. Below the plasma sources of the other microwave transmissive plates, the silicon nitride film 104 is deposited on the back surface with the deposition amount in accordance with the intensity of the power of microwaves output from each plasma source.

As a result, the unevenness illustrated in the corrected pattern (front surface) of FIG. 5(*c*: rightmost) could be made on the surface of the corrected silicon oxide film 101. That is, it was possible to forcibly distort the silicon oxide film

101 into the corrected pattern (front surface) of FIG. 5(c: rightmost) in accordance with the deposition amount of the silicon nitride film 104 regardless of the distribution of the surface of the silicon oxide film 101 of the pattern 1 illustrated in FIG. 5(a: leftmost) of the substrate W1 before the back surface deposition.

The pattern 2 (front surface) in FIG. 5(b) illustrates the state of the unevenness (distortion) of the silicon oxide film 101 on the front surface of a substrate W2 having a diameter of 300 mm, which is an example of the substrate W, before the back surface film. Similar results were obtained for the substrate W2.

That is, on the substrate W2, in accordance with the on/off states of the seven plasma sources illustrated in FIG. 5(A) and the on/off states of the seven plasma sources illustrated in FIG. 5(B), the silicon nitride film 104 was deposited on the back surface with the deposition amount the same as in the case of the substrate W1. As a result, the corrected pattern 2 illustrated in FIG. 5(b: center) indicated a distribution substantially the same as the corrected pattern 1 illustrated in FIG. 5(a: center). Also, the corrected pattern 2 illustrated in FIG. 5(b: rightmost) indicated a distribution substantially the same as the corrected pattern 1 illustrated in FIG. 5(a: rightmost).

As a result, for the substrate W2, the unevenness substantially the same as the corrected pattern (front surface) of FIG. 5(c: center or rightmost) could be formed on the front surface of the silicon oxide film 101 after correction. From the foregoing, it has been found that the corrected pattern (front surface) can be varied freely by controlling the deposition amount (and the distribution of deposition) of the silicon nitride film 104 by the intensity of the power of the microwaves output from the seven plasma sources.

[Substrate Bonding]

Figure 6:
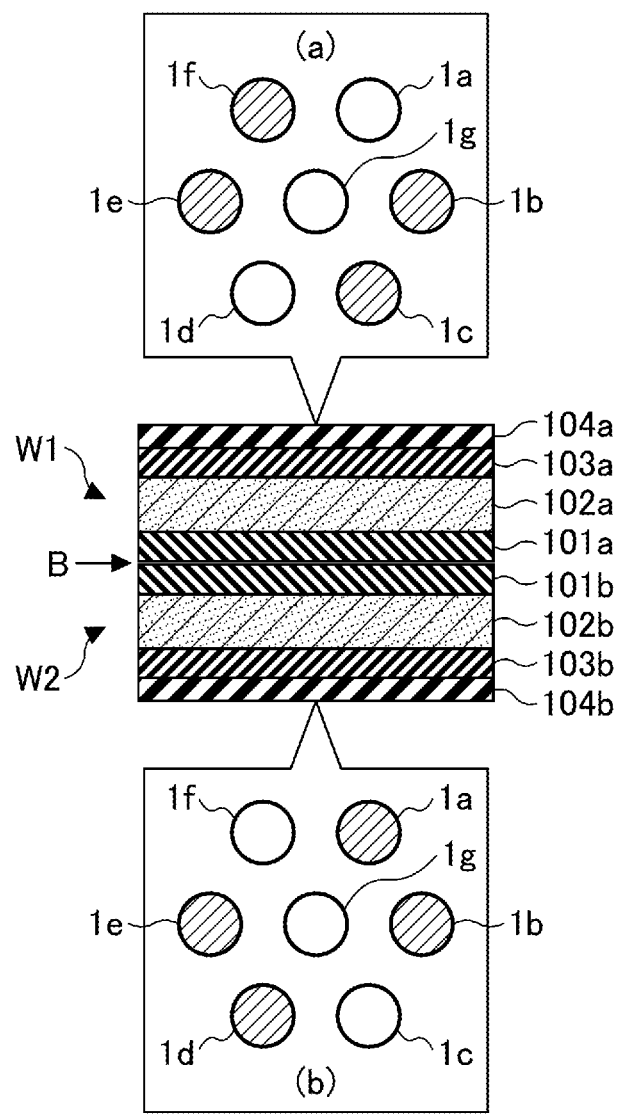
FIG. 6 is a diagram illustrating an example of bonding together substrates after being processed by the plasma processing method according to the embodiment.
Figure 7:
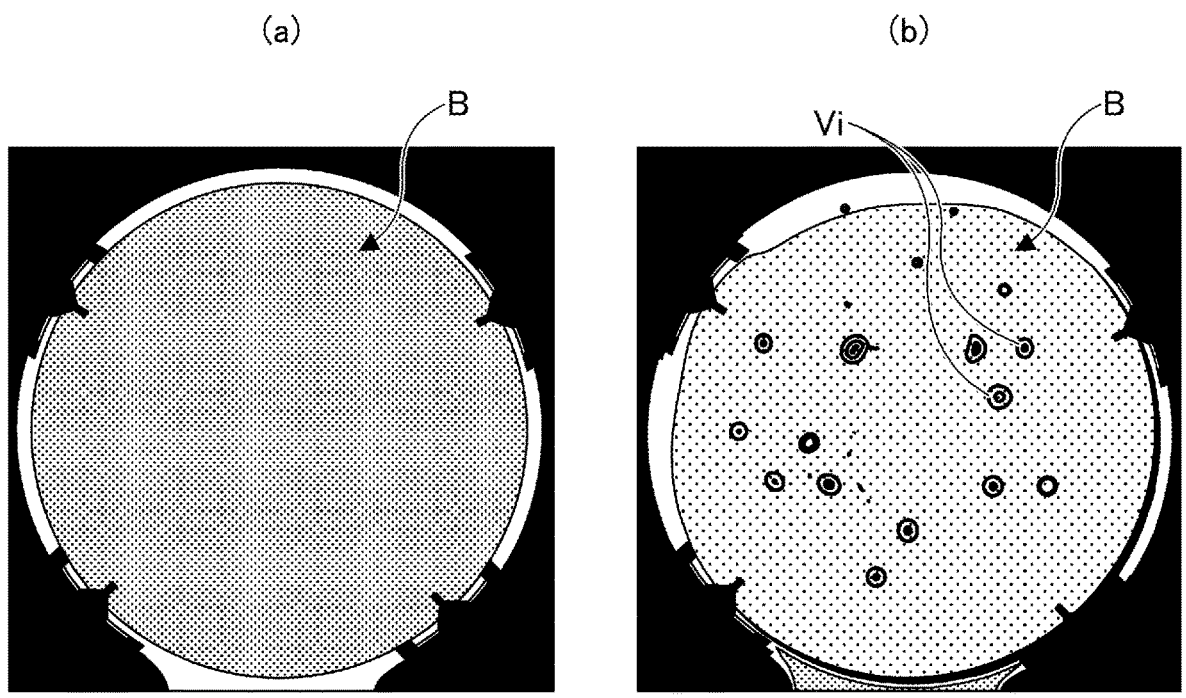
FIG. 7 is a diagram illustrating an example of a result of bonding together the substrates according to the embodiment.

Back surface deposition on the substrates W1 and W2 and bonding of the substrates W1 and W2 described above will be described with reference to FIGS. 6 and 7. FIG. 6 is a diagram illustrating an example of bonding together substrates after being processed by the plasma processing method according to the embodiment. FIG. 7 is a diagram illustrating an example of a result of bonding together the substrates according to the embodiment.

For example, the on/off state of each plasma source is controlled as illustrated in FIG. 5(A) and FIG. 6(a) to deposit a silicon nitride film 104a with the desired deposition amount at the desired position on the back surface of the substrate W1. Accordingly, the unevenness of a silicon oxide film 101a on the front surface of the substrate W1 is corrected to the corrected pattern of FIG. 5(c: center).

Also, the on/off state of each plasma source is controlled as illustrated in FIG. 5(B) and FIG. 6(b) to deposit a silicon nitride film 104b with the desired deposition amount at the desired position on the back surface of the substrate W2. Accordingly, the unevenness of a silicon oxide film 101b on the front surface of the substrate W2 is corrected to the corrected pattern of FIG. 5(c: most right).

In this state, the silicon oxide films 101a and 101b of the substrates W1 and W2 of FIG. 6 are caused to face each other and are bonded together as illustrated by the contact surface B. At this time, the unevenness of the silicon oxide film 101a on the front surface of the substrate W1 and the unevenness of the silicon oxide film 101b on the front surface of the substrate W2 are reversed patterns. Therefore, the positions of the protruding portions of the front surface of the substrate W2 are aligned with the positions of the recessed portions of the silicon oxide film 101a on the front surface of the substrate W1, and the positions of the recessed portions of the front surface of the substrate W2 are aligned with the positions of the protruding portions of the silicon oxide film 101a on the front surface of the substrate W1 to be bonded together. As a result, as illustrated in FIG. 7(a), at the contact surface B between the silicon oxide film 101a of the substrate W1 and the silicon oxide film 101b of the substrate W2, the substrate W1 and the substrate W2 could be bonded together without voids.

Conventionally, as illustrated in FIG. 7(b), when the front surface of the substrate W1 or the substrate W2 is distorted, voids occur on the surface where the substrate W1 and the substrate W2 are bonded together, or the distortion state of the substrate W1 and the substrate W2 after being bonded is deteriorated, which is a cause of a defective product. In addition, defects, such as peeling off the silicon oxide film 101 deposited on the surface of the front substrate W1 or the substrate W2 due to stress, may occur.

On the other hand, when the plasma processing method according to the present embodiment is executed, the substrate W1 and the substrate W2 can be bonded together without voids by forcibly forming distortion on the front surface of the substrate W1 and the front surface of the substrate W2.

In Example 1, the silicon nitride film 104 was deposited with a desired deposition amount at a desired position without measuring the distortion amount (unevenness) of the front surface of the substrate W before the back surface deposition. However, the distortion amount on the front surface or the back surface of the substrate W prior to back surface deposition may be measured.

Then, based on the measured result and based on the measured distortion amount on the front surface or the back surface of the substrate W, the intensity of the power introduced from each plasma source may be controlled so as to adjust the deposition amount of the silicon nitride film 104. Thus, the deposition amount and the deposition position of the silicon nitride film 104 may be specified by the distortion amount of the film on the front surface of the substrate W before correction, and the back surface deposition may be performed. That is, in Example 1, the distortion amount on the front surface or the back surface of the substrate W prior to back surface deposition may be measured or may not be measured. It should be noted that because it makes it possible to identify locations of the silicon nitride film 104 to be deposition based on the measurement result, it is preferable to measure the distortion amount on the front surface or the back surface of the substrate W prior to back surface deposition even in Example 1.

[Example of Measuring Film Distortion]

Figure 8:
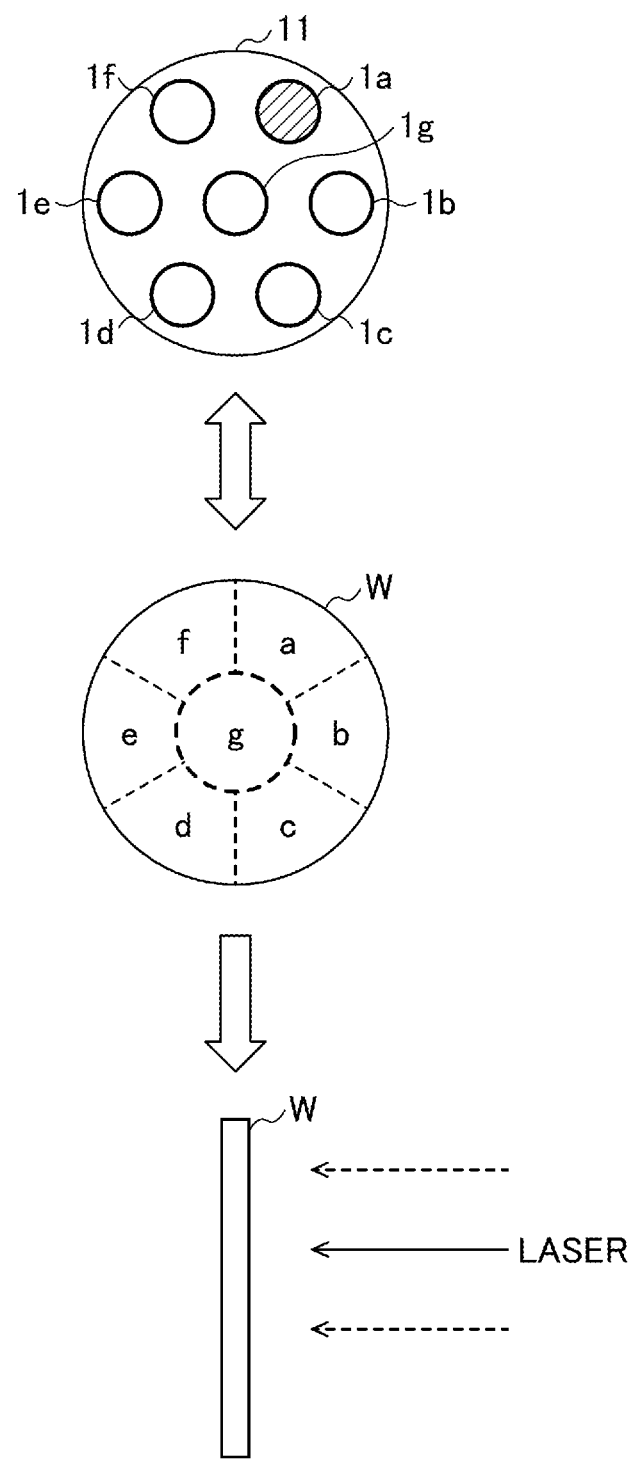
FIG. 8 is a diagram for explaining an example of a method of measuring the distortion of a film according to an embodiment.

An example of measuring the distortion of a film will be described with reference to FIG. 8. FIG. 8 is a diagram for explaining an example of a method of measuring the distortion of a film according to an embodiment.

In FIG. 8, the area of the substrate W is divided into blocks a to g corresponding one-to-one to plasma sources of the microwave transmissive plates 1a to 1g to calculate the average value of the distortion amounts at each block. As illustrated in FIG. 8, the distortion amount in each block is measured by vertically arranging the substrate W, irradiating the front surface or the back surface of the substrate W to be measured with scanning laser light, and imaging the reflected light by a CMOS sensor. The laser light enables to measure the amount of distortion such as warpage and waviness of the substrate W due to stress in a non-contact manner. It should be noted that the method of measuring the distortion amount on the front surface or the back surface of the substrate W described above is an example and the present disclosure is not limited to this. For example, the plasma amount for each area may be determined in the following steps.

The distortion amount of the entire wafer is measured (step S11). The average of the distortion amount of the entire wafer is measured (step S12). The wafer is divided into areas corresponding to arrangement of a plurality of plasma sources, and the average of the distortion amount for each area is measured (step S13). The plasma amount for each area is determined by comparing the average of the distortion amount of the entire wafer with the average of the distortion amount for each area (step S14).

Example 2

Figure 9:
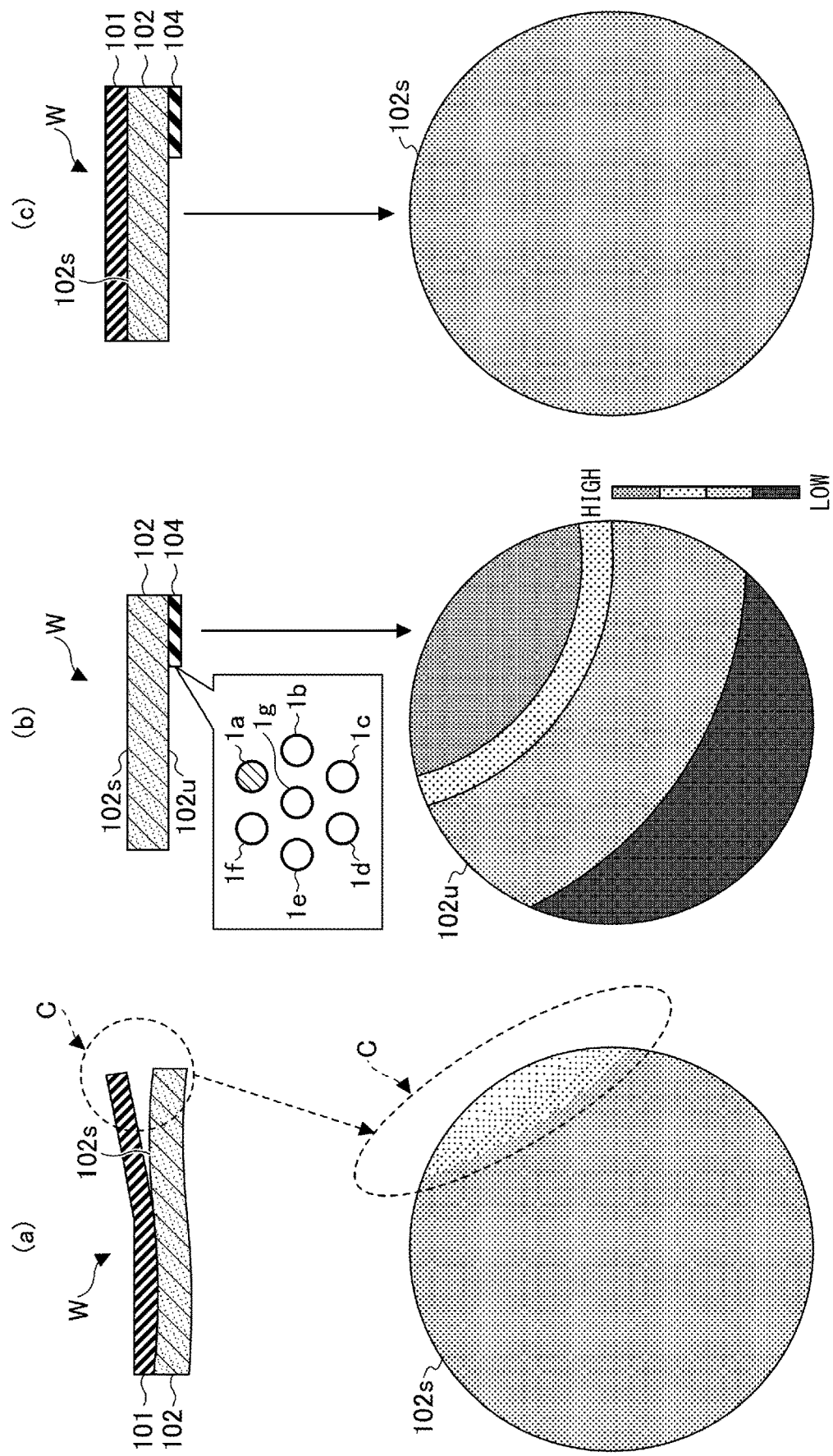
FIG. 9 is a diagram illustrating an example of Example 2 of the plasma processing method according to the embodiment.

Next, Example 2 of the plasma processing according to the embodiment will be described with reference to FIG. 9. FIG. 9 is a diagram illustrating an example of Example 2 of the plasma processing method according to the embodiment. In Example 1, a desired distribution of unevenness was forcibly generated on the front surface of the substrate W by the back surface deposition of the substrate W. Example 1 of the plasma processing according to the embodiment is suitable for a case in which the distortion of the film on the front surface of the substrate W is small or a case in which it is possible to forcibly distort the substrate W.

Meanwhile, in Example 2, a desirable film is locally formed on the back surface of the substrate W in accordance with the measurement result of the distortion amount on the front surface or the back surface of the substrate W so that the distortion of the film on the surface of the substrate W is eliminated by the back surface deposition of the substrate W and the surface is made flat. Example 2 of the plasma processing according to the embodiment is suitable for a case in which the distortion of the film on the front surface of the substrate W is large or a case in which it is impossible to forcibly distort the substrate W.

For example, as illustrated in FIG. 9(a), the substrate W has a film structure in which a silicon oxide film 101 is deposited on the front surface of the silicon base 102. In a case in which the distortion is large at the C area of the base 102 of the substrate W, the silicon oxide film 101 at the C area may be peeled off from the base 102 due to the distortion of the base 102. The lower part of FIG. 9(a) is a view of the front surface 102s of the base 102 viewed from the upper surface with respect to the film structure of the upper part of FIG. 9(a). In this case, the C area at the front surface 102s of the base 102 is distorted. In Example 2, a silicon nitride film 104 is deposited on the back surface at the C area of the base 102.

The obtained measurement result indicates that distortion is present at the C area of the front surface 102s of the silicon base 102 illustrated in FIG. 9(a). Based on this measurement result, as illustrated by the film structure at the upper portion of FIG. 9(b), the silicon nitride film 104 is locally deposited on the back surface 102u of the base 102 corresponding to the C area. The deposition amount of the silicon nitride film 104 is determined in accordance with the distortion amount. Specifically, the intensity of the power introduced from each of the plurality of plasma sources is controlled so as to apply film stress to planarize the silicon oxide film 101 on the front surface of the substrate W. Here, in order to deposit the silicon nitride film 104 at the location corresponding to the C area at the back surface 102u of the base 102, the plasma source of the microwave transmissive plate 1a corresponding to the C area at the back surface 102u of the base 102 is controlled to be in the on state and the other plasma sources are controlled to be in the off state. Thereby, the silicon nitride film 104 can be deposited locally at the location corresponding to the C area at the back surface 102u of the base 102 that is the position below the plasma source of the microwave transmissive plate 1a.

The silicon nitride film 104 has a compressive stress. Accordingly, as illustrated in the lower part of FIG. 9(b), a distribution of film stress is generated on the back surface 102u of the base 102 in accordance with the compressive stress of the silicon nitride film 104 on the back surface of the base 102. Thereby, the distribution of the film stress on the front surface 102s of the base 102 is changed. As a result, the front surface 102s of the base 102 is planarized as illustrated in the lower part of FIG. 9(c). Therefore, as illustrated in the upper part of FIG. 9(c), the silicon oxide film 101 deposited on the front surface 102s of the base 102 can be prevented from being peeled off.

As described above, the distortion of the substrate W can be adjusted according to the plasma processing method in accordance with the present embodiment. Thereby, it is possible to bond the films on the front surfaces of the two substrates W together without causing voids. In addition, it is possible to avoid defects such as peeling off the film deposited on the front surface of the substrate W due to stress. In addition, the back surface deposition can relieve or reduce the stress of the film on the front surface, thereby increasing the electrical conductivity of the film.

In this manner, by controlling the intensity of the power of microwaves output from a plurality of plasma sources, the deposition amount of the desired film deposited on the back surface of the substrate W can be controlled, and the stress of the film on the front surface of the substrate W can be controlled.

The direction of the stress varies depending on the desired film to be deposited on the back surface. Therefore, in the step of depositing the desired film, it is preferable to have the intensity of the power output from each plasma source so as to adjust the deposition amount of the desired film in accordance with the direction of the stress that the desired film has.

In Example 1 of the plasma processing method according to the present embodiment, the step of individually controlling the intensity of the power controls the intensity of the power introduced from each of a plurality of plasma sources so as to apply first film stress to a film on a first surface of a first target substrate, the step of depositing a desired film generates plasma of gas by the intensity of the power introduced from each of the plurality of plasma sources and deposits a desired film on a second surface of the first target substrate that is an opposite surface of the first surface of the first target substrate so as to apply the first film stress to the film on the first surface, when bonding a film on a first surface of a second target substrate and the film on the first surface of the first target substrate together, the step of individually controlling the intensity of the power controls the intensity of the power introduced from each of the plurality of plasma sources so as to apply second film stress so that a distortion state of the film on the first surface of the second target substrate is a state obtained by reversing a distortion state of the film on the first surface of the first target substrate, the step of depositing the desired film generates the plasma of the gas by the intensity of the power introduced from each of the plurality of plasma sources and deposits a desired film on a second surface of the second target substrate that is an opposite surface of the first surface of the second target substrate so as to apply the second film stress to the film on the first surface of the second target substrate. Thereby, it is possible to bond the two target substrates together without causing voids.

In Example 2 of the plasma processing method according to the present embodiment, the step of individually controlling the intensity of the power controls the intensity of the power introduced from each of the plurality of plasma sources so as to apply film stress to planarize the film on the first surface of the target substrate, and the step of depositing the desired film generates plasma of gas by the intensity of the power introduced from each of the plurality of plasma sources and deposits the desired film on the second surface of the target substrate that is an opposite surface of the first surface of the target substrate so as to apply the film stress to planarize the film on the first surface of the target substrate. Thereby, the peeling of the film on the substrate W due to the distortion of the substrate W can be prevented.

The plasma processing method and the plasma processing apparatus according to the embodiment disclosed herein should be considered exemplary in all respects and are not limited thereto. The embodiment as described above may be changed and modified in various forms without departing from the appended claims and spirit thereof. The matters described in embodiments as described above may take other configurations to the extent not inconsistent, and may be combined to the extent not inconsistent.

What is claimed is:

1. A plasma processing method that is executed by a plasma processing apparatus including a processing container containing a target substrate, a plurality of plasma sources, and a gas supply apparatus for supplying gas, the plasma processing method comprising:
   supplying the gas from the gas supply apparatus into the processing container;
   individually controlling intensity of power introduced from each of the plurality of plasma sources into the processing container; and
   generating plasma of the gas by the intensity of the power introduced from each of the plurality of plasma sources and depositing a desired film on a second surface of the target substrate that is an opposite surface of a first surface of the target substrate so as to apply desired film stress to a film on the first surface.

2. The plasma processing method according to claim 1, wherein the depositing the desired film deposits the desired film on the second surface with a deposition amount corresponding to the intensity of the power introduced from each plasma source so as to apply film stress to adjust distortion of the film on the first surface.

3. The plasma processing method according to claim 1, wherein the depositing the desired film deposits the desired film on the second surface with a deposition amount corresponding to the intensity of the power introduced from each plasma source so as to apply film stress to correct distortion of the film on the first surface.

4. The plasma processing method according to claim 1, further comprising:
   measuring a distribution of film stress of the first surface or the second surface,
   wherein the individually controlling the intensity of the power controls, based on the measured distribution of the film stress, the intensity of the power introduced from each of the plasma sources so as to adjust a deposition amount of the desired film.

5. The plasma processing method according to claim 1, wherein the individually controlling the intensity of the power controls the intensity of the power introduced from each of the plasma sources so as to adjust a deposition amount of the desired film in accordance with a direction of stress that the desired film has in the depositing the desired film.

6. The plasma processing method according to claim 1, wherein the supplying the gas supplies gas containing silicon and nitrogen, and,
   wherein the depositing the desired film adjusts compressive stress that the silicon nitride film has, by depositing a silicon nitride film on the second surface as the desired film and adjusting a deposition amount of the silicon nitride film.

7. The plasma processing method according to claim 1, wherein the individually controlling the intensity of the power controls the intensity of the power introduced from each of the plurality of plasma sources so as to apply first film stress to a film on a first surface of a first target substrate,
   wherein the depositing the desired film generates the plasma of the gas by the intensity of the power introduced from each of the plurality of plasma sources and deposits a desired film on a second surface of the first target substrate that is an opposite surface of the first surface of the first target substrate so as to apply the first film stress to the film on the first surface,
   wherein, when bonding a film on a first surface of a second target substrate and the film on the first surface of the first target substrate together, the individually controlling the intensity of the power controls the intensity of the power introduced from each of the plurality of plasma sources so as to apply second film stress so that a distortion state of the film on the first surface of the second target substrate is a state obtained by reversing a distortion state of the film on the first surface of the first target substrate, and
   wherein the depositing the desired film generates the plasma of the gas by the intensity of the power introduced from each of the plurality of plasma sources and deposits a desired film on a second surface of the second target substrate that is an opposite surface of the first surface of the second target substrate so as to apply the second film stress to the film on the first surface of the second target substrate.

8. The plasma processing method according to claim 1, wherein the individually controlling the intensity of the power controls the intensity of the power introduced from each of the plurality of plasma sources so as to apply the film stress to planarize the film on the first surface of the target substrate, and
   wherein the depositing the desired film generates the plasma of the gas by the intensity of the power introduced from each of the plurality of plasma sources and deposits the desired film on the second surface of the target substrate that is an opposite surface of the first surface of the target substrate so as to apply the film stress to planarize the film on the first surface of the target substrate.

9. A plasma processing apparatus including a processing container containing a target substrate, a plurality of plasma sources, a gas supply apparatus for supplying gas, and a controller for controlling deposition of the target substrate,
   wherein the controller controls
   supplying the gas from the gas supply apparatus into the processing container;
   individually controlling intensity of power introduced from each of the plurality of plasma sources into the processing container; and generating plasma of the gas by the intensity of the power introduced from each of the plurality of plasma sources and depositing a desired film on a second surface of the target substrate that is an opposite surface of a first surface of the target substrate so as to apply desired film stress to a film on the first surface.

\* \* \* \* \*